United States Patent [19]

Rzeszewski et al.

[11] 4,041,535
[45] Aug. 9, 1977

[54] FREQUENCY SYNTHESIZER TUNING SYSTEM WITH SIGNAL SEEK CONTROL

[75] Inventors: Theodore S. Rzeszewski, Lombard; Paul D. Frantzis, Chicago, both of Ill.; Sotirios Sideris, Sunnyvale, Calif.

[73] Assignee: Matsushita Electric Corporation of America, Franklin Park, Ill.

[21] Appl. No.: 707,674

[22] Filed: July 22, 1976

[51] Int. Cl.² ............................................. H04N 5/44
[52] U.S. Cl. ................................. 358/191; 325/421; 325/464
[58] Field of Search .............................. 325/419–423, 325/464, 465, 468, 470, 453, 457; 358/191, 193, 195; 331/1 A; 334/14–16

[56] References Cited

U.S. PATENT DOCUMENTS

| 3,949,158 | 4/1976 | Rzeszewski et al. | 325/423 |
| 3,973,228 | 8/1976 | Mueller et al. | 325/464 |
| 3,980,951 | 9/1976 | Breeze et al. | 325/464 |

OTHER PUBLICATIONS

IEEE transaction on Concumer Electronics on "Simplified TV Tuning System" by Hilliker, pp. 61–68, 2-1976.

Primary Examiner—Robert L. Griffin
Assistant Examiner—Jin F. Ng
Attorney, Agent, or Firm—Drummond, Nelson & Ptak

[57] ABSTRACT

A television tuning system employs a frequency synthesizer system for establishing the tuning of the receiver. A first programmable frequency divider controlled by a reversible counter is connected between the output of a reference oscillator and a phase comparator to which the output of the local oscillator, after passing through another programmable frequency divider, also is applied. The phase comparator output is a tuning voltage used to control the tuning of the local oscillator. A logic circuit is coupled to sense predetermined relationships of signals from a picture carrier detector, a sound carrier detector, an AFT discriminator circuit, and the presence of vertical synchronization signal components for changing the count in the reversible binary counter to adjust the first programmable frequency divider to compensate for channel frequency offsets which may occur in excess of the pull-in range of the AFT discriminator circuit. To permit operation of the receiver as a signal seek receiver, a pair of signal seek pushbuttons for the "up" and for the "down" direction, respectively, are provided. Operation of either of these pushbuttons functions in conjunction with further logic circuitry and in conjunction with timing circuitry to automatically step tune the receiver channel-by-channel in the selected direction until a channel with a signal present is sensed by the first logic circuit, whereupon the signal seek circuit operation is disabled until one or the other of the signal seek pushbuttons is reactivated.

7 Claims, 2 Drawing Figures

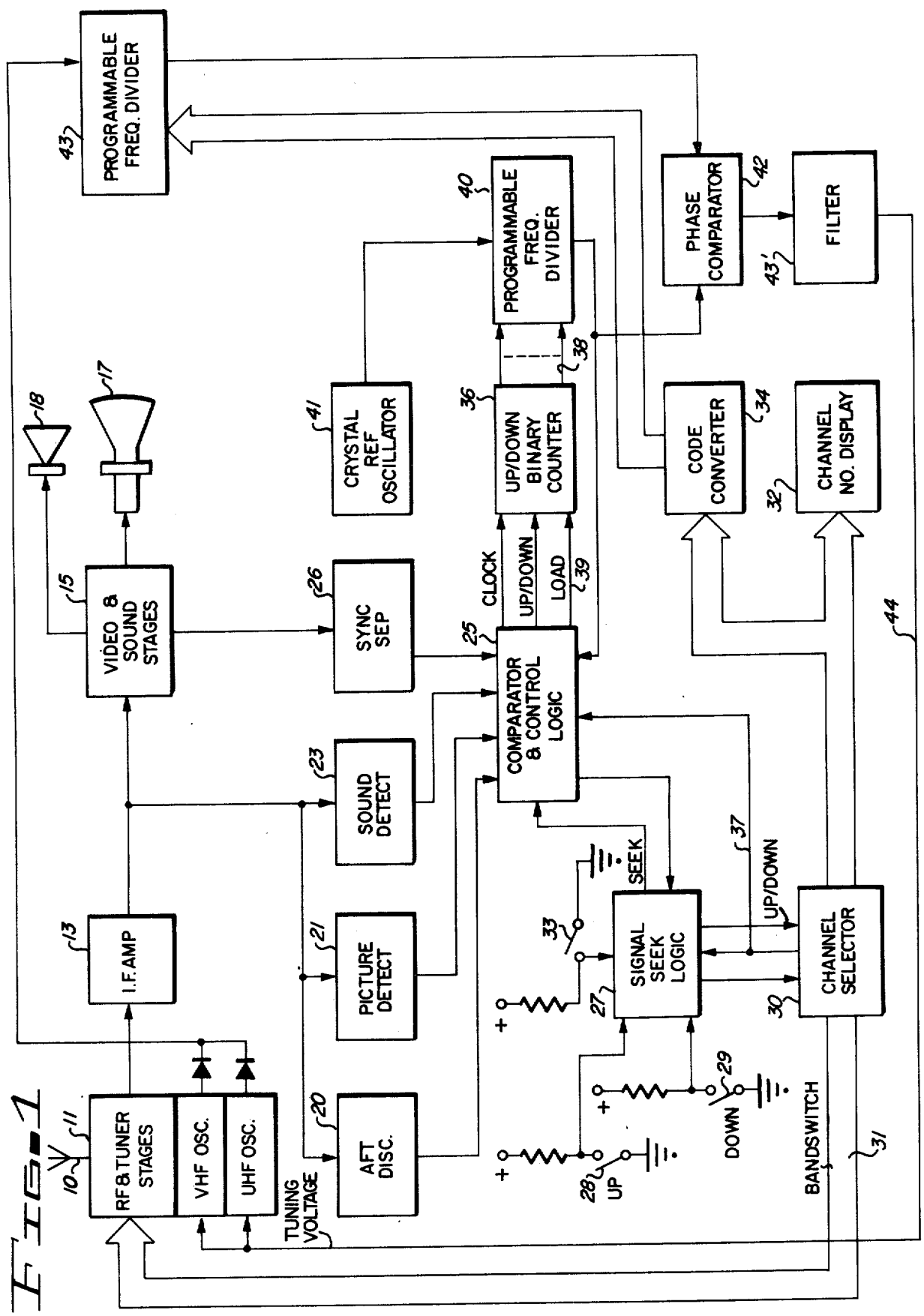

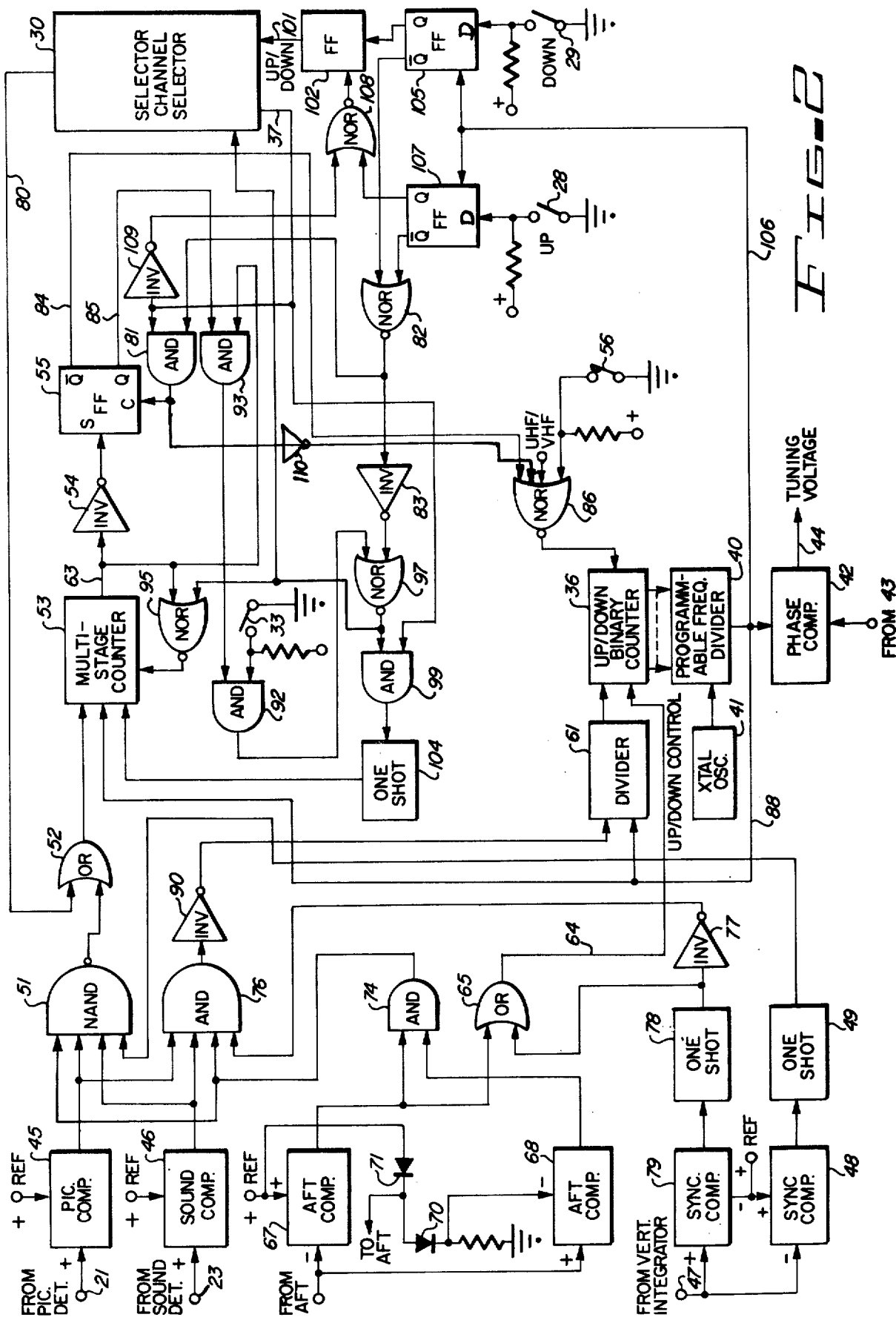

FREQUENCY SYNTHESIZER TUNING SYSTEM WITH SIGNAL SEEK CONTROL

RELATED APPLICATIONS

This application is directed to an improvement in the tuning systems disclosed in co-pending applications Ser. No. 635,716, filed Nov. 26, 1975, and 695,855, filed June 4, 1976, both of which are assigned to the same assignee as the present application. The subject matter of both of these co-pending applications is incorporated into the disclosure of this application by reference.

BACKGROUND OF THE INVENTION

As described in the above-mentioned co-pending applications, one adjustment which still generally must be made in most television receivers is a fine tuning adjustment. The systems disclosed in the above co-pending applications are frequency synthesizer tuning systems having a wide pull-in range and operating to automatically correct for frequency offsets without affecting the operation of the conventional frequency synthesizer in the tuning system used. In addition, application Ser. No. 695,855 permits manual fine tuning adjustment to override the frequency synthesizer tuning adjustments when such overriding manual tuning is desired.

The systems of these co-pending applications represent a substantial improvement over systems of the prior art which either used solely a manual fine tuning adjustment or which merely used a conventional frequency synthesizer system without a frequency offset correction provision. In the past, there has been some interest in providing a television receiver with a "signal seek" feature, that is, a tuning system which, upon command, seeks the next available transmission signal, skipping intermediate unused channels or channels which do not have a signal broadcast on them at the time the receiver is being operated.

Because of the relatively high cost of incorporating a signal seek tuning system into a television receiver, such systems have not found acceptance in commercial receivers. In addition, signal seek tuning actually appears to be incompatible with a frequency synthesizer tuning system having an automatic offset correction feature as disclosed in co-pending application Ser. No. 635,716.

It would be desirable, however, to incorporate a signal seek function into a frequency synthesizer tuning system of the type disclosed in the above-mentioned co-pending applications if this could be accomplished at a reasonable cost and with minimum complexity. This would substantially improve the maximum flexibility of the frequency synthesizer tuning system and would simplify the addition of a remote control function into the system.

SUMMARY OF THE INVENTION

Accordingly, it is an object of this invention to provide an improved tuning system for a television receiver.

It is an additional object of this invention to provide an improved frequency synthesizer tuning system for a television receiver.

It is another object of this invention to provide an improved frequency synthesizer tuning system for a television receiver which includes a signal seek feature.

It is a further object of this invention to provide a frequency synthesizer tuning system for a television receiver having a provision for adjusting the synthesizer loop for frequency offsets and in addition including a provision for a compatible signal seek tuning function.

In accordance with a preferred embodiment of this invention, a frequency synthesizer tuning system for the tuner of a television receiver includes a voltage-controlled local oscillator in the tuner and a stable reference oscillator. A first programmable frequency divider is connected between the output of the reference oscillator and one input to a phase comparator. A second programmable frequency divider is connected between the output of the local oscillator and the other input to the phase comparator. The output of the phase comparator then comprises a control signal which is supplied to the local oscillator to control the frequency of its operation.

Selection of a desired channel by the viewer causes a predetermined division ratio to be established in the programmable frequency divider each time a channel is selected. Similarly, depression of either an "up" or "down" signal seek pushbutton causes a predetermined division ratio for the next higher or lower channel, respectively, to be established in the programmable frequency divider. In addition, a control unit coupled with the AFT circuit operates to change the division ratio of the programmable frequency divider whenever predetermined signal conditions exist in the AFT discriminator circuit. This, then, permits the system to adjust for frequency offsets of the signal which otherwise would cause the station to be mistuned. If the control circuit, however, does not locate a received signal within a pre-established period of time, and the system is in its signal seek mode of operation, the next higher or lower channel (in the direction selected by the opertion of the signal seek pushbutton) is stepped to automatically; and the offset correction circuit once again searches for a received signal. This cycle repeats until a received signal is sensed by the control circuit.

BRIEF DESCRIPTION OF THE DRAWINGS

FIG. 1 is a block diagram of a television receiver employing a preferred embodiment of the invention; and FIG. 2 is a more detailed block diagram of a portion of the circuit shown in FIG. 1.

DETAILED DESCRIPTION

Referring now to the drawings, the same reference numbers are used in both figures to designate the same or similar components. In addition, in FIG. 1, the reference numbers of components which also are disclosed in co-pending application Ser. No. 635,716, referred to above, are the same as used in that application.

FIG. 1 is a block diagram of a television receiver which may be a black-and-white or color television receiver to which has been added a frequency synthesizer tuning system of the type disclosed in the above-mentioned co-pending application Ser. No. 635,716. Most of the circuitry of FIG. 1 is the same as the corresponding figure of such co-pending applicaton, but to that circuitry is added circuitry for implementing a "signal seek" system operation of the receiver as desired by the viewer.

A major portion of the circuitry of the television receiver shown in FIG. 1 is conventional and, for that reason, it has not been shown in detail. Transmitted composite television signals either received over the air or distributed by means of a master antenna TV distribution system as received by an antenna 10 or on antenna input terminals to the receiver. As is well known, these composite signals include picture and sound carrier components and synchronizing signal components, with the composite signal being applied to an RF and tuner stage 11 of the receiver. The stage 11 includes the RF amplifiers and tuner sections of the receiver including a VHF oscillator section and a UHF oscillator section, specifically indicated as such in the stage 11 of FIG. 1. Preferably, the UHF and VHF local oscillators are voltage-controlled oscillators, the frequency of which is varied in response to a tuning voltage applied to them to effect the desired tuning of the receiver.

The output of the RF and tuner stages 11 is applied to an IF amplifer stage 13 which supplies the conventional picture (video) and sound IF signals to video and sound detectors and processing stages 15 of the receiver. The stages 15 may be of any conventinal type used to separate, detect, amplify and otherwise process the signals for application to a cathode ray tube 17 and a loudspeaker 18 which reproduce the picture and sound components, respectively, of the received signal.

The output of the IF amplifier 13 also is supplied to a conventional AFT or automatic fine tuning discriminator circuit 20 for developing an automatic fine tuning control voltage. In addition, the outut of the IF amplifier stage 13 is supplied to a narrow-band picture carrier detection circuit 21 and a narrow-band sound carrier detection circuit 23 which produce output signals whenever a carrier is tuned to the narrow band of frequencies each of these circuits is designed to detect. For a properly tuned television station, the picture carrier detection circuit 21 and the sound carrier detection circuit 23 both simultaneously produce output signals. If neither of these circuits produces an output signal for a selected channel, this is indicative that no transmitted signal is present for that channel. In addition, if only one of the circuits 21 or 23 produces an output signal, this is indicative of a grossly mistuned condition of the receiver.

The outputs of the discriminator 20 and the two detectors 21 andd 23 are supplied to a comparator and control logic circuit 25 which also is provided with synchronizing signals, such as the vertical synchronizing signals obtained from a conventional synchronizing signal separator circuit 26 coupled with the video and sound stages 15 of the receiver.

When the viewer desires to select a new channel, he enters the desired channel number into a channel selector keyboard 30. There are a number of different keyboards and associated memory circuits which may be used to accomplish this function, and the particular design is not important to this invention. If should be noted that ideally the channel selector keyboard and its associated circuitry includes a memory circuit which is preprogrammed to provide output signals corresponding to the entry of data from the keyboard portion of the channel selector 30. In addition, the channel selector keyboard 30 also may include switching circuitry for providing a band switch function over band switching control leads 31 to the RF and tuner stages 11. This band switching operation also is a straightforward approach to relate the appropriate band switching information to the tuner according to the channel which has been selected. The channel selector keyboard 30 then provides output signals which operate a channel number display 32 to provide an appropriate display of the selected channel number to the viewer.

The signals which are utilized to operate the channel number display 32 also are applied to a code converter circuit 34 which decodes the selected channel number into a parallel-encoded signal. This may be done in any conventional manner and may be in the form of BCD code or another suitable code. This encoded signal is applied to corresponding inputs of a programmable frequency divider 43 to cause the division number to relate the divided-down frequency of the tuner oscillators to the frequency of a reference oscillator 41 for properly tuning the receiver to the selected channel. Conventional frequency synthesizer techniques are employed except the code converter 34 is necessary because of nonuniform channel spacing of the television signals. It is most convenient to cause the programmable frequency divider 43 to divide by numbers corresponding to the oscillator frequency of the selected channel. For example, 101, 107, 113 . . . up to 931.

A timing or "load" pulse is applied over a lead 37 to the comparator and control logic 25 each time a new channel number is selected by the keyboard or by the circuitry of the channel selector 30. This pulse causes the comparator and control logic circuit 25 to supply a corresponding pulse on a lead 39 to load or enter a fixed binary number into a reversible binary counter 36. The manner in which this is done is explained more fully in conjunction with FIG. 2. This number is selected to be at or near the midpoint of the count capacity of the counter 36.

The outputs of each of the stages of the binary counter 36 then are applied over parallel output leads 38 to corresponding inputs of a second programmable frequency divider 40. A fixed-frequency, stable, reference oscillator 41 is coupled to the input of the frequency divider 40; so that the outpt signal of the divider 40 is a stable reference frequency used to maintain tuning of the receiver to the selected channel. This divided-down stable reference signal is supplied to one of two inputs to a phase comparator circuit 42. The other input to the phase comparator circuit 42 is supplied from the selected one of the VHF or UHF oscillators in the tuner stages 11 through the programmable divider circuit 43. The phase comparator 42 operates in a conventional manner to supply a direct current (DC) tuning control signal through a filter circuit 43' and over a lead 44 to the oscillators in the tuner stages 11 to change and maintain their operating frequency.

The operation of the system which has been described thus far is very similar to that of a relatively conventional frequency synthesizer system. If, however, there is a frequency offset in the received signal, causing the carrier of the received signal to be displaced from the frequency which it should have to some other frequency, it is possible that the system would give the appearance of mis-tuning the received station. To eliminate this disadvantage and still retain the advantages of fully automatic "hands-off" frequency synthesizer tuning, the comparator and control logic circuit 25 is employed in conjunction with the reversible binary counter 36 and the programmable frequency divider 40 to automtically maintain proper tuning.

The comparator and control logic circuit 25 responds to the outpt of the AFT discriminator circuit 20 to see if the output voltage of the discriminator is within a specified window. If that condition is present, the control logic circuit 25 determines that there is no frequency offset; and the system operates as a conventional frequency synthesizer tuning system so long as the picture detector 21, sound detector 23 and vertical synchronizing signals are present. If, however, the AFT voltage at the output of the AFT discriminator 20 is outside this window, or if the proper outputs are not present from the detectors 21 and 23 or the sync separator 26, the comparator and control logic circuit 25 operates to change the count in the binary counter 36. This change is in the proper direction established by the circuit 25 in response to its inputs to effect a corresponding change in the division ratio or division number of the programmable frequency divider 40. This, in turn, causes the reference oscillator frequency supplied to the phase comparator 42 to be automatically changed to correct for the frequency offset in the received carrier signal.

The system always maintains the crystal stability of the oscillator 41 in its operation to accurately maintain the tuning which has been established. An additional mode of operation, namely a "signal seek" mode of operation, often is desired in television receivers. This type of operation is one in which the viewer, often working in conjunction with a remote control input, desires to step the television receiver tuning to the next higher or next lower available channel which is being transmitted in the area in which the receiver is used. In a "signal seek" receiver, the receiver automatically skips over channel positions which are unused or on which no signals are being transmitted at the time the receiver is used.

Initially, it would appear that the feature for automatically correcting for tuning offset is incompatible with a "signal seek" capability of the receiver, because a "seek" in a frequency synthesizer system must progress from one channel location to the next (either up or down) looking for a channel where the sensors, in the form of the AFT discriminator 20, picture detector 21, sound detector 23 and sync separator 26 tell the system there is a station present. But it also is necessary not to pass by a station which may have a frequency offset in which these same sensors must have a composite response wide enough to sense offsets that may range as much as ± 2 Megahertz. This, however, makes a conventional seek system more susceptible to locking to false signals and also runs contrary to what is ordinarily desired for correct tuning. These problems, however, have been overcome with the signal seek logic circuit 27 shown in FIG. 1. This logic circuit operates in conjunction with the channel selector 30 and a pair of pushbutton control switches 28 and 29, to, at the option of the viewer, cause the system to operate in a signal seek mode of operation in either the "up" or "down" direcrtion, as selected, respectively, by the switches 28 and 29.

The manner in which this operation takes place in conjunction with the comparator and control logic circuit 25 will become apparent in conjunction with the description of the operation of the circuit shown in FIG. 2.

The comparator and control logic circuit 25 and the signal seek logic circuit 27 are shown in greater detail in FIG. 2 to which reference now should be made. It should be noted that although two separate circuits 25 and 27 are shown in FIG. 1 to simplify the description of the operation of the system, the logic of these two circuits is closely interrelated and in some portions is shared as will become apparent in conjunction with the description of the operation of the circuit shown in FIG. 2. In addition, the reversiable binary counter 36, programmable frequency divider 40, crystal oscillator 41 and phase comparator 42 also are shown in FIG. 2 to indicate the interrelation of these components of the circuit with the logic circuits 25 and 27, which comprise the remainder of the circuitry shown in FIG. 2.

Ideally, the center count which is set into the counter 36 upon the selection of a new channel by the channel selector 30, either by entry in the keyboard or under the control of the signal seek logic circuit 27, should result in accurate tuning of the receiver to the desired channel, as determined by the division ratio set into the programmable frequency divider 43 (FIG. 1). The tuning accuracy of the system is a function of the stability of the crystal-controlled reference oscillator 41. As also described previously, however, if a frequency offset is present in the signal of the selected channel, the comparator control logic circuit 25 causes the count in the binary counter 36 to be increased or decreased by an amount sufficient to change the division ratio of the programmable frequency divider 40 to effect the desired change in the tuning voltage from the output of the phase comparator 42 necesary to properly tune the local oscillators in the RF and tuner stages 11 of the receiver.

Assume, initially, that the signal seek logic circuit 27 is disabled. This is accomplished by closing a normally-open switch 33 to apply ground potential to the signal seek logic circuit 27 (FIG. 1). This switch 33 also is shown in FIG. 2, and the manner in which closure of this switch functions to defeat the signal seek logic circuit operation 27 is explained subsequently. With the circuit 27 disabled by closure of the switch 33, the presence of a selected channel signal transmission is detected by the picture detector 21, the sound detector 23, and the sync separator circuit 26 (FIG. 1). If a carrier is detected by the picture carrier detector circuit 21, the output of the picture carrier detector applied to a comparator circuit 45 causes the output of the comparator circuit 45 to go high (positive). Similarly, the detection of a sound carrier by the sound carrier detector circuit 23 causes the output of a sound comparator circuit 46 to go high. Additional information for determing whether or not the receiver is properly tuned to a selected channel is supplied from the AFT discriminator 20 (FIG. 1) to a pair of AFT comparator circuits 67 and 68 (FIG. 2).

An additional piece of information used to determine whether the receiver is properly tuned to a received station is obtained from the synchronizing separator circuit 26 in the form of vertical sync pulses applied to a terminal 47. These pulses are compared in a snyc comparator circuit 48 which produces negative or low clock pulses at the vertical rate on its output each time a vertical snyc pulse is applied to the input terminal 47. Each of the pulses at the output of the comparator 48 triggers a one-shot multivibrator 49, connected as a missing pulse detector sometimes called a retriggerable one-shot multivibrator, to its unstable condition. The timing period of the one-shot multivibrator 49 is greater than the interval between vertical synchronizing pulses; so that for normal transmission, the one-shot multivibrator 49 remains in its unstable state since each trigger pulse applied to it restarts its timing interval. This produces a high output from the multivibrator 49 so long as vertical synchronizing pulses continue to be detected by the comparator circuit 48.

As a consequence, all four of the inputs to a NAND gate 51 are high if signal transmission is detected by the presence of picture and sound carriers in proper relation to each other, by an AFT signal in the window established by the ART comparators 67 and 68, along with vertical synchronizing pulses. The output of the NAND gate 51, when this condition occurs, then goes low which clears a multi-stage counter 53 through an OR gate 52 to an initial "zero" count condition and also prevents the counter 53 from counting so long as this "low" input is applied to it.

The other input to the OR gate 52 is obtained from the channel selector circuit 30 and is a normally low signal for the selection of a valid channel number by the channel selector 30. This is, the potential on the lead 80 applied to the second input of the OR gate 52 is low whenever a number for a valid television channel 2-83 is selected by the channel selector 30. If for some reason the channel selection by the channel selector 30 is an invalid channel number not corresponding to one of channels 2 to 83, the potential on the lead 80 goes high and overrides control of the multi-stage counter 53 by the NAND gate 51, permitting the counter 53 to count in response to the application of clock pulses applied to it.

Each time a new channel number is selected by the channel selector 30 either by the viewer entering a new channel number on a keyboard or in response to a pulse from the signal seek logic portion of the circuitry, a "clear" pulse is applied to a flip-flop 55 through an AND gate 81. This pulse also feeds a NOR gate 86 which applies the pulse to the counter 36. In this way the flip-flop 55 and counter 36 are reset each time a new channel is selected. This pulse constitutes one of the two inputs to the AND gate 81, the second input to which is obtained from a NOR gate 82. In the condition of operation under description, this second input is a normally high enabling input for the AND gate 81. The flip-flop 55 then produces a "high" output on its $\overline{Q}$ output lead 84 and produces a "low" output on its Q output lead 85.

The output lead 84 is one of the four inputs to a NOR gate 82 which produces a low output whenever any of the inputs to it are high. An offset correction defeat switch 56 is connected to one of the three inputs of this NOR gate and this switch is normally closed unless the offset correction feature of the system is not desired. So long as the switch 56 is closed, the lowermost input to the NOR gate 86 is provided with a lower or ground potential, as shown in FIG. 2. A VHF/UHF input normally also has a low signal on it. The input from the AND gate 81 on the lead 37 is normally high; however, it passes through an inverter 110 and provides a normally low signal except for the reset condition described above. The "high" output on the lead 84 from the flip-flop 55 thus causes a "low" output from the NOR gate 86.

The output of the NOR gate 86 is connected to the reversible counter 36; and whenever this output goes low, the aforementioned predetermined count is set into the counter 36. In addition, so long as the output of the gate 86 remains low, the counter 36 is prevented from changing count. The flip-flop 55 is connected as a divide-by-two circuit. Therefore, the above-mentioned output condition on the lead 84 alternates between a hig level and a low level. The high level forces the counter 36 to a fixed count while the phase-locked loop is pulling in, and the low level allows a "localized smart search" to take place.

Thus, if the output of the NAND gate 51 indicates that there is a television signal at the particular channel selected, and vertical synchronizing pulses are correctly received, the output of the NAND gate 51 clears the multi-stage counter 53 and prevents it from counting any further in response to pulses applied to its clock input terminal from the output of the programmable frequency divider 40 over a lead 88. Under this condition of operation, the output of the flip-flop 55 on lead 84 remains high; so that the system functions as a conventional frequency synthesizer system.

If, however, following the selection of a channel which loads the binary counter 36 and sets the flip-flop 55 to its high condition on lead 84, the NAND gate 51 does not produce a "low" clear pulse to the multi-stage counter 53, but instead produces a high or positive output, the counter 53 is enabled for operation and is advanced in its count by pulses applied to its clock input from the output of the programmable frequency divider 40 on a lead 88. A preestablished count then is reached to provide a clock pulse over an output lead 63 and through an inverter 54 to the flip-flop 55 to clock the flip-flop to its opposite output condition, with a low output on lead 84 and a high output on the lead 85. This causes the output of the NOR gate 86 to go to a logical "1" or high output condition, which in turn enables the reversible counter 36 to commence counting in response to clock pulses applied to it and in the direction specified on the lead 64. These clock pulses also are the same clock pulses appearing on the lead 88 at the output of the programmable frequency divider 40 and are supplied to a frequency divider 61.

The pulses are passed through the divider 61 only if the output of an AND gate 76 is low at the same time; so that a high output is obtained from an inverter 90 connected between the AND gate 76 and the divider 61. So long as the output of the inverter 90 is high, the clock pulses on the lead 88 operate the divider 61 to supply clock pulses to the binary counter 36. These clock pulses cause the counter 36 to change its count in accordance with the nature of an up/down control signal applied to its over a lead 64 from the output of an up/down control OR gate 65. If this condition has been caused by a channel that has been offset, a point will be reached when the outputs from the picture detector 21, from sound detector 23, and the vertical integrator on the terminal 47 once again indicate that a proper received channel is present. This, then, produces an output pulse from the NAND gate 51 which clears and stops the operation of the multi-stage counter 53. Also, the output from the gate 76 goes high, and is inverted by the inverter 90 to thereafter inhibit further operation of the divider 61 preventing any additional output clock pulses from being applied to the counter 36.

Thus, the output on lead 84 of the flip-flop 55, when it is high, enables the system to operate with all of the advantages of a conventional frequency synthesizer. When the output signal on the lead 84, however, is low, it enables the synthesizer to correct for cases where the channel frequency is not of the proper value. Once correct tuning is attained, the disabling of the divider 61 prevents a further change in the count of the up/down binary counter 36 and the system once again operates in the manner of a conventional frequency synthesizer.

If, now, for some reason, the AFT voltage supplied to the inputs of the comparator circuits 67 and 68 should rise above the voltage between the diodes 70 and 71 to a potential greater than one diode drop, the output of the comparator 67 goes low, while the output of the comparator 68 remains high. This causes the output of the AND gate 74 to go low, which in turn causes the output of the AND gate 76 also to go low. As a result, the output of the inverter 90 goes high and enables the divider circuit 61 once again for operation. As a consequence, the clock pulses applied to the divider 61 on the lead 88 once again are passed through the divider 61, after being divided down, to change the count in the binary counter 36 in response to the application of such clock pulses. As described previously, the direction in which the count of the binary counter 36 changes is controlled by the output of the OR gate 65 which has inputs supplied to it from the comparator 67 and the output of the one-shot multivibrator 78.

For the condition under discussion, the incoming signal is tuned low, that is, toward the next lower adjacent channel. For this condition, the sync pulse output from the vertical integrator applied to the terminal 47 also is normal; so that the output of the one-shot multivibrator 78 remains low. Thus, both inputs to the OR gate 65 are low and the potential on its output also is low. This results in a low signal on the lead 64 applied to the binary counter 36, causing the count in the binary counter 36 to advance for the application of each clock pulse applied to it from the output of the divider 61. This, in turn, causes corresponding changes in the division ratio or division number of the programmable frequency divider 40, thereby resulting in a change in the tuning voltage from the phase comparator 44.

When proper tuning once again is achieved, the AFT signal will be back again within the window established by the diodes 70 and 71; and the outputs of both AFT comparators 67 and 68 go high. Thus, the outputs of the AND gates 74 and 76 also go high. This, once again, inhibits the passage of pulses by the divider circuit 61, thereby terminating the application of further clock pulses to the reversible counter 36. Once this occurs, tuning of the oscillators in the tuning stages 11 is maintained by the normal output of the phase comparator 42 via the lead 44.

If the incoming received signal is tuned high, the AFT voltage applied to the inputs of the comparator 67 and 68 drops below the potential at the junction of the diodes 70 and 71. This is tuning toward the next adjacent higher channel and results in a relatively negative output from the discriminator circuit 20 because the picture carrier is tuned toward the adjacent channel sound trap. Once the voltage of this signal decreases to more than one diode drop below the voltage at the junction of the diodes 70 and 71, the output of the AFT comparator 68 goes low, while the output of the comparator 67 remains high. As a consequence, the outputs of the AND gates 74 and 76 once again go low and clock pulses are passed through the divider circuit 61. The up/down control potential on the output of the OR gate 65, however, now is high since the OR gate 65 has a high input applied to it from the comparator 67. Thus, the counter 36 is caused to count in the opposite or reverse direction. This effects the desired reference oscillator frequency correction in the same manner described previously but in the opposite direction.

As is well known, there are two positions that the AFT signal from the AFT discriminator 20 crosses the "zero" reference voltage; and a lock of the AFT circuit can occur at either of these two positions. One is the correct position for the picture carrier and the other results from a mistuning toward the adjacent channel sound trap. In this condition, however, the sound information gets into the sync separator circuit 26 and results in a phase inversion of the recovered sync signal obtained at the output of the separator. When this inverted signal is applied to the terminal 47, the normally high output of the comparator 79 now changes to supply negative going pulses to the one-shot multivibrator 78 in synchronism with the pulses applied to the terminal 47.

The one-shot multivibrator 78 now is repeatedly retriggered or reset by the negative pulses applied to its input; so that its output, which was a normally low output, goes high and remains high for the duration of this mistuning condition. This output is inverted by the inverter 77 to cause the output from the AND gate 76 to go low, which in turn is inverted by the inverter 90 to enable the divider circuit 61, so that clock pulses can be applied through it to the reversible counter 36. At the same time, the positive output from the OR gate 65 results in a positive or high signal on the lead 64 to cause the binary counter 36 to count in its reverse direction, effecting a tuning of the receiver downward toward the intended channel, since this condition is indicative of a receiver which is mistuned high. Once the required correction has been accomplished, the outputs of the synchronizing signal comparators 48 and 79 revert back to the original condition of operation, the counter 53 once again is reset, and the output of the inverter 90 goes low to inhibit further operation of the divider 61. No more clock pulses then are passed to the counter 36.

The operation of the portion of the circuit which has been described thus far is substantially the same as the operation of the circuit disclosed in co-pending application Ser. No. 635,716. When the system is to be operated in a "signal seek" mode, however, the switch 33 is opened to apply a positive enabling potential to one of the two inputs to an AND gate 92. The other input to the AND gate 92 is obtained from an AND gate 93, which has the output on the lead 63 from the counter 53 applied to one of its inputs and the output from the flip-flop 55 appearing on the lead 85 applied to its other input.

When the circuit is in its "seek" mode of operation, it can operate in either the "up" or "down" direction. For the present, assume that it is operating in the "up" direction. The manner in which the direction is selected is described subsequently.

The flip-flop 55 operates as a divide-by-two circuit. It is clocked from the counter 53 through the inverter 54. Each time the multi-stage counter 53 reaches the maximum count, it produces a "carry-out" pulse on the lead 63. This pulse does two things. First, it loads the counter 53 with a programmed number. This shortens the time it takes for the counter to count to the maximum count again. Secondly, it provides a clock for the divide-by-two flip-flop 55. Therefore, the outputs Q and $\overline{Q}$ of the flip-flop 55 are changing at half the frequency of the clock input and they are of opposite polarity. However, each time a new channel is selected, the flip-flop 55 is cleared by a low output from the AND gate 81. This causes the Q output to be low and the $\overline{Q}$ output to be high until the next clock pulse when these outputs reverse polarity. With output Q low, the lead 85 is low and the AND gate 93 does not pass the next carry-out pulse from the counter 53 on the lead 63 to the gate 92. Therefore, no channel change takes place. This is the time interval that the phase-lock loop of FIG. 1, consisting of the local oscillator 11, divider 43, phase comparator 42, filter 43', divider 40, and reference oscillator 41 is permitted to pull-in and establish the nominal tuning for the channel.

The next carry-out pulse now causes the Q output of the flip-flop 55 to be high and $\overline{Q}$ to be low. This enables the gate 93, and the next carry-out pulse on the lead 63 produces a channel change. Also, the lead 84 was high previously and is now low; therefore, previosly the NOR gate 86 was forced low, loading the counter 36 and inhibiting it from counting. However, $\overline{Q}$ now is low, and the counter 36 can count, producing the "localized smart search" in response to the up/down control on lead 64 and clock pulses from the divider 61. If no channel is found before the next carry-out pulse of the lead 63, the carry-out pulse is passed through gates 93, 92, and 97 to the channel selector 30 to change to the next channel, up or down, depending on the level of lead 101. The manner in which this is accomplished may be any suitable means and the result is the same as if the viewer had keyboarded into the channel selector 30 the next channel number, either higher or lower, as determined by the control lead 101. The direction may be controlled by a simple gating circuit taking any of a number of conventional logic configurations. The result, however, is a changing in the division ratio of the frequency divider 43 (FIG. 1) which, in turn, re-establishes the channel tuning to a different channel.

At the same time, a "load" pulse appears on the lead 37 in the same manner as occurs when a new channel is manually selected by keyboarding a new channel number into the channel selector 30. This pulse on the lead 37 is passed by the AND gate 99 to trigger a one-shot multivibrator 104, which enables the multi-stage counter 53 for operation. The time-out interval of the multivibrator 104 is longer than the time interval required to cause the multi-stage counter 53 to count from its load condition to the point where the carry-out pulse appears on the lead 63. It should be noted that the one-shot multivibrator 104 also is activated to provide this time interval for manually selected channel changes in the channel selector 30 since, when the system is operating in its non-seek mode, the AND gate 99 is permanently enabled by a positive potential applied to its upper input from the output of the NOR gate 97.

At the same time, the pulse on the lead 37 is passed by the AND gate 81 to clear the flip-flop 55 to the condition where the output on the lead 84 is high and the output on the lead 85 is low, as described previously. If the offset correction circuitry detects a channel at this new position, the system operates as described previously to stop the counting operation of the multi-stage counter 53 and the up/down binary counter 36. The system then operates in the manner of a conventional frequency synthesizer tuning system in the manner which previously has been described.

If, however, a channel is not found in response to this "change channel" signal appearing at the output of the NOR gate 97, the multi-stage counter 53 is permitted to advance in response to the pulses appearing on the lead 88 and results in clocking the flip-flop 55. As described previously, this then enables the up/down binary counter 36, and it commences counting in the direction established by the signal on the lead 64 in the same manner described previously for the offset frequency correction operation. This can be termed a localized "smart search" mode of operation when the system is in its "seek" mode of operation.

If a channel is found in response to this localized search, prior to the time that the multi-stage counter 53 provides the next output pulse on the lead 63, the operation of the counter 53 is stopped in response to the output of the NAND gate 51 and the operation of the counter 36 is stopped in response to the output of the AND gate 76.

As stated previously, the switches 28 and 29 are preferably in the form of pushbutton switches which are only momentarily closed to initiate the seek in whichever direction is selected by the chosen switch. For example, if the "down" switch 29 is momentarily closed, a flip-flop 105 provides a "low" logic "O" pulse to the flip-flop 102 preset, which then produces one of its two stable state outputs to the channel selector 30 indicative of a downward "seek" selection. This is used in the channel selector 30 to cause the channel selector to step to the next channel down from the one previously selected; and, so long as the flip-flop 102 remains set to this condition, each time a pulse is obtained from the output of the NOR gate 97 and applied to the channel selector 30, the channel selector steps to the next channel in the "down" direction. The main purpose of flip-flops 105 and 107 is to effect "debouncing". They are connected as standard clocked D (delay) flip-flops, and any contact bounce produced by either of the switches 28 or 29 is eliminated because these flip-flops are immune to input changes at any time other than the positive-going clock transitions. The clock is provided on the lead 106 from the divider 40.

Closing the switch 29 causes the seek to be in a downward direction. The "low" generated by closing switch 29 is applied to the data input of the clocked flip-flop 105. The outputs of the flip-flop 105 are indicative of switch 29 closure when Q is low and $\overline{Q}$ is high, but are delayed from the switch closure by the clock entry time. The high $\overline{Q}$ output of flip-flop 105 is applied to the input of the NOR gate 82. This forces the output of the NOR gate 82 to go low. This, in turn, disables the AND gate 81, and forces the output of the NOR gate 97 to go low, since it has a high input applied to it from the output of the inverter 83.

On the next clock pulse on the lead 106, immediately following release of the "down" pushbutton 29, the "high" on the D input to the flip-flop 105 returns the flip-flop 105 to its original condition of operation, with a high output applied to the preset of the flip-flop 102 and a low output applied to the NOR gate 82. This has no effect on the flip-flop 102, but it does cause both inputs to the NOR gate 82 once again to be low, so that its output goes high. This enables the AND gate 81 and the NOR gate 97 for the signal seek operation previously described. When the output of the inverter 83 goes low, a high trigger pulse is applied from the output of the NOR gate 97 to step the channel selector 30 to the next channel, in the present example, in the "down" direction. The operation described previously in the signal seek mode then continues until a channel is detected in the manner described above.

Similarly, if it now is desired to cause the seek to be in the opposite direction, a momentary closure of the switch 28 may be made by the viewer. This clocks the "high" indicative of switch 28 closure to the $\overline{Q}$ output of the flip-flop 107. This high is applied to the lower input of the NOR gate 108 and a corresponding low output from Q output of the flip-flop 107 causes the NOR gate 82 to go high. As soon as the $\overline{Q}$ output of flip-flop 107 is clocked high by the next clock pulse on the lead 106 after switch 28 is closed, the NOR gate 108 goes low. Since this output is connected to the clear input of the flip-flop 102, the flip-flop 102 is triggered to its opposite state of operation, causing the direction of operation of the channel selector 30 in response to pulses obtained from the output of the NOR gate 97 to be in the "up" direction. The sequence of operation for stepping the channel selector 30 to the next channel (now in the "up" direction) and for setting the flip-flop 55 via the AND gate 81 is the same as described previously.

Once a station has been found by the signal seek circuit operation in either direction, the system locks onto that station and operates in the manner of a conventional frequency synthesizer. The receiver remains in such a state of operation until a new channel is selected by the channel selector 30 or until either the "up" signal seek switch 28 is momentarily closed or the "down" signal seek switch 29 is momentarily closed to initiate a new seek search function.

Whenever the viewer desires to disable the seek function, the switch 33 may be closed to apply a disabling ground potential to the AND gate 92. This prevents "change channel" pulses from passing through the AND gate 92 and the NOR gate 97 to the channel selector 30. Even with the switch 33 closed, however, it is possible to use the pushbutton switches 28 and 29 to step the channel selector one channel in the selected direction in response to each momentary closure of these switches. This result is obtained because of the change in signal lever at the output of the inverter 83 in response to this operation, which does result in a "change channel" output pulse from the NOR gate 97 each time this operation is effected. Only a single channel is stepped under these conditions, however, and there is no channel-by-channel "seek" function to the next highest available. If the channel to which the channel selector 30 is stepped does not have a signal on it, no additional stepping of the channel selector 30 takes place automatically through the operation of the multistage counter 53 and flip-flop 55 since the AND gate 92 is disabled. Of course, if the switch 33 is opened, the signal seek operation resumes.

While the foregoing description of a signal seek operation which is compatible with a frequency synthesizer tuning system having an automatic offset correction has been directed to a specific circuit configuration, it should be noted that the circuit which has been selected for the purpose of illustrating the invention may be varied within the scope of the invention by those skilled in the art.

I claim:

1. A frequency synthesizer signal seek tuning system for a tuner of a television receiver capable of receiving a composite television signal, said system including in combination:

reference oscillator means providing a reference signal at a predetermined frequency;

local oscillator means in the tuner providing a variable output frequency in response to the application of a control signal thereto;

a programmable frequency divider having an input coupled to said reference oscillator means for producing an output signal having a frequency which is a programmable fraction of the frequency of the signal applied to the input thereto from said reference oscillator means;

means coupled to the output of said programmable frequency divider and the output of said local oscillator means for developing a control signal and applying such control signal to said local oscillator means for controlling the frequency of operation thereof;

channel selection means coupled to said programmable frequency divider for establishing a predetermined initial programmable fraction therein each time a new channel is selected by said channel selection means;

control means coupled to the output of the tuner of the television receiver and further coupled to said programmable frequency divider for controlling said frequency divider to change the programmable fraction thereof in response to predetermined conditions of the signals from the tuner; and signal seek tuning means coupled to said channel selection means and said control means for causing said channel selection means to select a new channel in response to said predetermined conditions of the tuner signals persisting for a predetermined time period.

2. The combination according to claim 1, wherein the composite television signal has at least carrier signal components and synchronizing signal components and further including carrier sensing means coupled to receive at least the carrier signal components of the composite signal from the tuner and providing an output voltage indicative of the tuning of said receiver to a carrier component of said composite signal; and synchronizing signal component sensing means coupled to receive at least said synchronizing signal components of the composite signal for providing a first predetermined output with synchronizing signal components sensed thereby; wherein said control means is coupled to the outputs of said carrier sensing means and said synchronizing signal components sensing means and further coupled to said programmable frequency divider means for changing the programmable fraction thereof in response to first predetermined conditions of signals at the outputs of said carrier sensing means and said synchronizing signal components sensing means and the operation of said signal seek tuning means being terminated in response to second predetermined conditions of signals at the outputs of said carrier sensing means and said synchronizing signal components sensing means.

3. The combination according to claim 1, further including first and second switches in said signal seek tuning means for initiating a signal seek operation in the "up" and "down" directions, respectively, operation of one of said first and second switches causing said channel selection means to select the next channel in the selected direction and establishing said predetermined initial programmable fraction in said programmable frequency divider in response thereto.

4. The combination according to claim 3, wherein said control means terminates operation of said signal seek means in response to detection of second predetermined conditions of the signals from the tuner.

5. The combination according to claim 1, wherein said predetermined conditions of the tuner signals comprise first and second predetermined conditions, respectively; said programmable frequency divider has its input coupled to the output of said reference oscillator means; and wherein said control means includes reversible digital counter means coupled to said programmable frequency divider, and logic circuit means coupled to the output of the tuner for causing said counter means to count in one direction when said first predetermined conditions exist and to count in the opposite direction when said second predetermined conditions exist.

6. The combination according to claim 5, further including additional means coupled to said counter means and coupled to said logic circuit means for inhibiting operation of said signal seek tuning means and for preventing a change in the count of said counter means when third predetermined signal conditions exist in the tuner output.

7. The combination according to claim 6, further including a second programmable frequency divider coupled to the output of said local oscillator means and producing an output signal having a frequency which is a programmable fraction of the frequency of the signal applied to the input thereto from said local oscillator means; and wherein said channel selection means is further coupled to said second programmable frequency divider for controlling said second programmable frequency divider to establish the programmable fraction thereof each time a new channel is selected by said channel selection means.

* * * * *